United States Patent
Gaebler et al.

(10) Patent No.: US 10,068,935 B2
(45) Date of Patent: Sep. 4, 2018

(54) IMAGE LAG FREE PIXEL

(71) Applicant: X-FAB SEMICONDUCTOR FOUNDRIES AG, Erfurt (DE)

(72) Inventors: Daniel Gaebler, Apolda (DE); Xuezhou Cao, Plymouth (GB)

(73) Assignee: X-FAB SEMICONDUCTOR FOUNDRIES AG, Erfurt (DE)

(*) Notice: Subject to any disclaimer, the term of this patent is extended or adjusted under 35 U.S.C. 154(b) by 0 days.

(21) Appl. No.: 15/545,413

(22) PCT Filed: Jan. 22, 2015

(86) PCT No.: PCT/EP2015/051274
§ 371 (c)(1),
(2) Date: Jul. 21, 2017

(87) PCT Pub. No.: WO2016/116161
PCT Pub. Date: Jul. 28, 2016

(65) Prior Publication Data
US 2018/0019272 A1    Jan. 18, 2018

(51) Int. Cl.
H01L 27/146    (2006.01)

(52) U.S. Cl.
CPC .. H01L 27/14603 (2013.01); H01L 27/14612 (2013.01); H01L 27/14641 (2013.01); H01L 27/14643 (2013.01)

(58) Field of Classification Search
CPC ......... H01L 27/14603; H01L 27/14609; H01L 27/14614; H01L 27/14643
USPC ....................................................... 257/292
See application file for complete search history.

(56) References Cited

U.S. PATENT DOCUMENTS

| | | | |
|---|---|---|---|
| 5,625,210 A | 4/1997 | Lee et al. | |
| 6,657,665 B1* | 12/2003 | Guidash | H01L 27/14603 257/E27.131 |
| 7,977,717 B1 | 7/2011 | Innocent | |
| 8,138,535 B2 | 3/2012 | Innocent | |
| 2006/0102938 A1 | 5/2006 | Park et al. | |
| 2008/0018763 A1 | 1/2008 | Sato | |
| 2016/0133659 A1* | 5/2016 | Chao | H01L 27/14612 257/231 |

FOREIGN PATENT DOCUMENTS

EP    2 634 595    9/2013

OTHER PUBLICATIONS

International Search Report for PCT/EP2015/051274, dated Nov. 23, 2015, 7 pages.
Written Opinion of the ISA for PCT/EP2015/051274, dated Nov. 23, 2015, 8 pages.

* cited by examiner

*Primary Examiner* — Mark Prenty
(74) *Attorney, Agent, or Firm* — Nixon & Vanderhye PC

(57) ABSTRACT

A CMOS image sensor pixel (200) comprising a photosensitive element (101) for generating a charge in response to incident light; a plurality of charge storage elements (103); a plurality of transfer gates (102) for enabling the transfer of charge between the photosensitive element and an associated one of the charge storage elements; and one or more first electrical connections (201) for placing at least two of the plurality of charge storage elements in mutual electrical contact.

21 Claims, 5 Drawing Sheets

IMAGE LAG FREE PIXEL

This application is the U.S. national phase of International Application No. PCT/EP2015/051274 filed 22 Jan. 2015, which designated the U.S., the entire contents of which is hereby incorporated by reference.

TECHNICAL FIELD

The present invention relates to a CMOS image sensor pixel.

BACKGROUND 4 transistor CMOS image sensors (4TCISs) have been in widespread use since the 1980s. 4TCISs are increasingly employed in mobile devices, where attention is primarily focused on miniaturizing individual pixels. Whilst small pixels are desirable for mobile devices, for many scientific, medical and industrial applications where sensitivity is critical, larger pixels are often required. 4TCIS pixels include a transfer gate, which brings several advantages, such as enabling correlated double sampling to eliminate reset noise. However, the inclusion of a transfer gate can lead to a phenomenon known as image lag, which occurs when the time taken for electrons within a photodiode to move from the point of creation to the transfer gate exceeds the transfer gate pulse width, which defines the period for which the transfer gate is open.

Although image lag often has a severely negative impact on the pixel's utility, the present inventors are not aware of a repeatable and flexible design for a 4TCIS pixel specifically directed towards the reduction or elimination of image lag.

The inventors have appreciated that it would be desirable to provide a 4TCIS pixel which can be scaled up in size without exhibiting significant image lag. Embodiments of the present invention aim to provide such a 4TCIS pixel.

SUMMARY

Aspects of the invention are set out in the claims.

BRIEF DESCRIPTION OF THE DRAWINGS

Some embodiments of the invention will now be described by way of example only and with reference to the accompanying drawings, in which.

DETAILED DESCRIPTION 4 transistor CMOS image sensor (4TCIS) pixels are well known in the art and are becoming increasingly commonplace, being employed in devices such as digital cameras and mobile telephones. 4TCIS pixels are described, for example, in U.S. Pat. No. 5,625,210 A and U.S. Pat. No. 8,138,535 B2.

Figure 1:
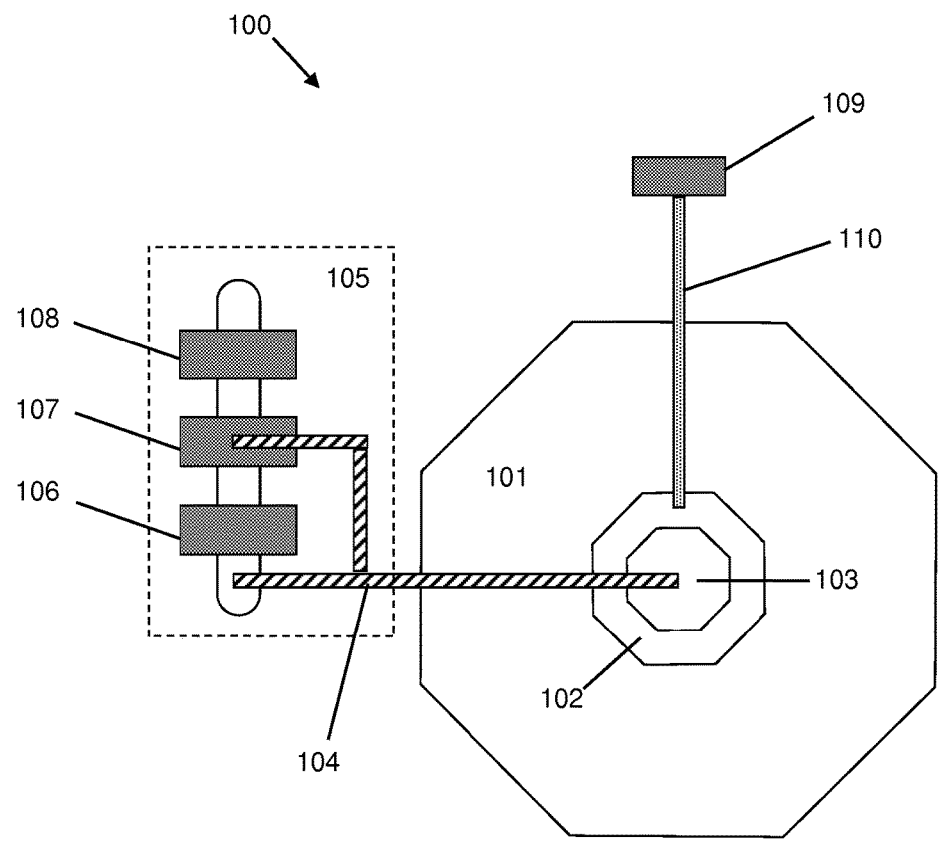
FIG. 1 shows a prior art 4TCIS pixel.

With reference to FIG. 1, 4TCIS pixels 100 known in the art typically comprise a photosensitive element 101 such as a pinned photodiode, a floating diffusion 103, a transfer gate 102, and a set of readout electronics 105 comprising a reset transistor 106, an amplification transistor 107 and a selection transistor 108. The floating diffusion 103 is connected 104 to the amplification transistor 107. The transfer gate 102 is connected 110 to a voltage source 109 which enables the transfer gate 102 to be opened and closed in a controlled manner.

An alternative, the 3 transistor CMOS image sensor pixel, is similar to the 4TCIS except for the exclusion of the transfer gate 102. The inclusion of a transfer gate 102 has distinct advantages, such as enabling correlated double sampling to eliminate reset noise. Therefore the 4TCIS pixel is often more desirable than the simpler 3 transistor pixel. However, the present inventors have appreciated that 4TCIS pixels known in the art suffer from a deleterious phenomenon known as image lag, and that this issue becomes increasingly prominent as the size of the photosensitive element 101 is increased, which may be necessary in order to improve the sensitivity of the pixel. Image lag occurs when the time taken for electrons generated within the photosensitive element 101 to reach the transfer gate 102 is longer than the width of the voltage pulse applied to the transfer gate 102 to control the transfer of charge into the floating diffusion 103. This results in not all of the generated charge being read-out in a single frame, and can lead to phenomena such as ghosting when the pixels are employed in an image sensor.

An aspect of the present invention is, irrespective of the pixel size, to shorten the path the light-generated electrons need to travel in order to reach a transfer gate 102 when compared with existing 4TCIS pixel designs, thus reducing or completely eliminating image lag. This is achieved by employing multiple transfer gates 102 in combination with multiple floating diffusions 103, placed in mutual electrical contact. Furthermore, by employing a multiplicity of transfer gates 102 it is possible to achieve an appreciable guiding electric field in all regions of the photosensitive element 101, enabling the transfer of electrons more quickly than if only a single transfer gate 102 were used.

Figure 2:
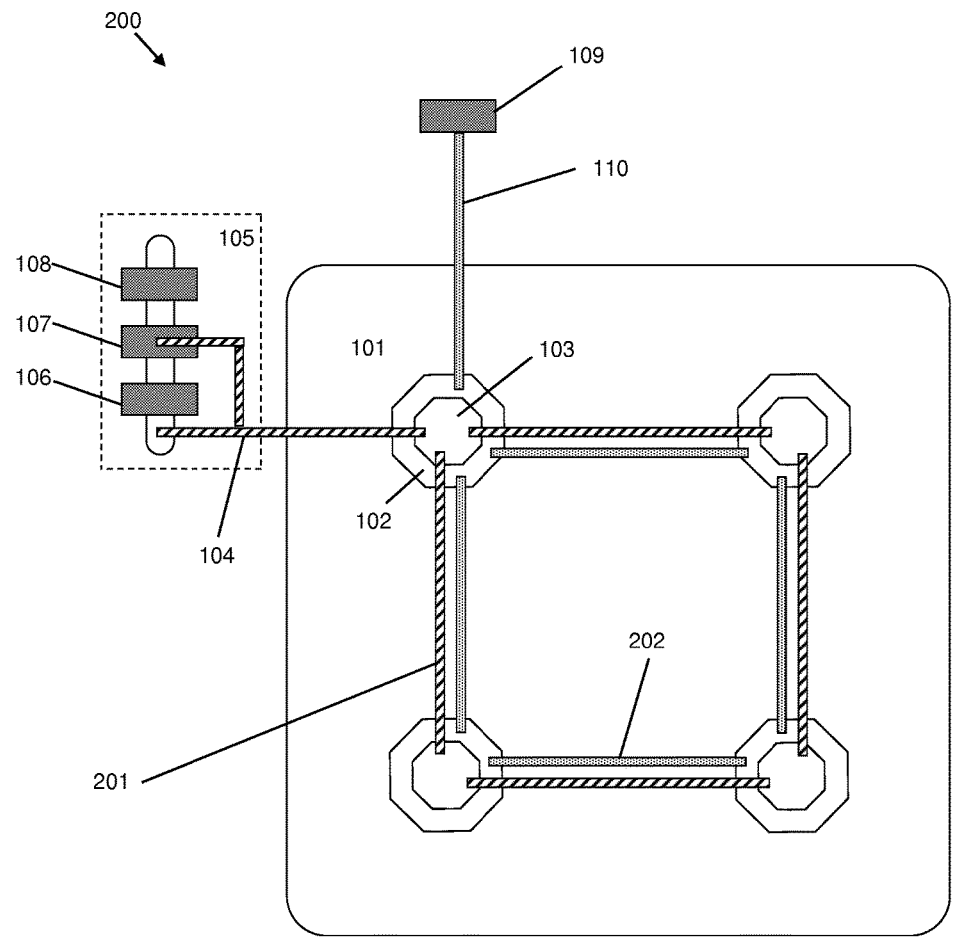
FIG. 2 shows a 4TCIS pixel according to an embodiment of the present invention.

FIG. 2 illustrates a layout view of a 4TCIS pixel 200 employing multiple transfer gates according to an embodiment of the present invention. According to this exemplary embodiment, the pixel comprises a single photosensitive element 101, e.g. a pinned photodiode. Multiple transfer gates 102 are placed within the single photosensitive element 101. In the embodiment of FIG. 2 a total of 4 ring-type transfer gates 102 having octagonal geometry are placed within the photosensitive element 101. The embodiment depicted in FIG. 2 is entirely exemplary and alternative configurations are contemplated, e.g. using a different number of transfer gates (at least two) arranged in an alternative fashion, and/or each assuming a different geometry.

The individual charge storage elements, e.g. floating diffusion regions 103, are placed in mutual electrical contact by virtue of being connected together with a set of first electrical connections 201, preferably ohmic. This has the result of increasing the charge storage capacity of the combined floating diffusion, which is advantageous since large pixels may require a greater charge storage capacity. The total charge accumulated within the combined floating diffusion may be read out by a single set of readout devices 105.

In the exemplary embodiment of FIG. 2, the plurality of transfer gates 102 are connected together by a set of second electrical connections 202, preferably ohmic, such that the transfer gates can be operated in parallel. Each transfer gate 102 comprises a gate for controlling the state of the transfer gate, i.e. open or closed, in response to an applied voltage. For this purpose, a voltage source 109 is connected 110 to the plurality of transfer gates 102 to enable the transfer gates 102 to be opened and closed. The voltage source 109 may be operated by a controller. It is also envisaged that the transfer gates 102 could alternatively be controlled separately, such that they are not connected in parallel. The first and second electrical connections, 201 and 202 respectively, may each comprise discrete, separate portions or may alternatively each consist of a single, continuous portion (such as a continuous "ring" or "C" shaped structure). The set of first electrical connections 201 is electrically isolated from the second set of electrical connections 202.

Figure 3:
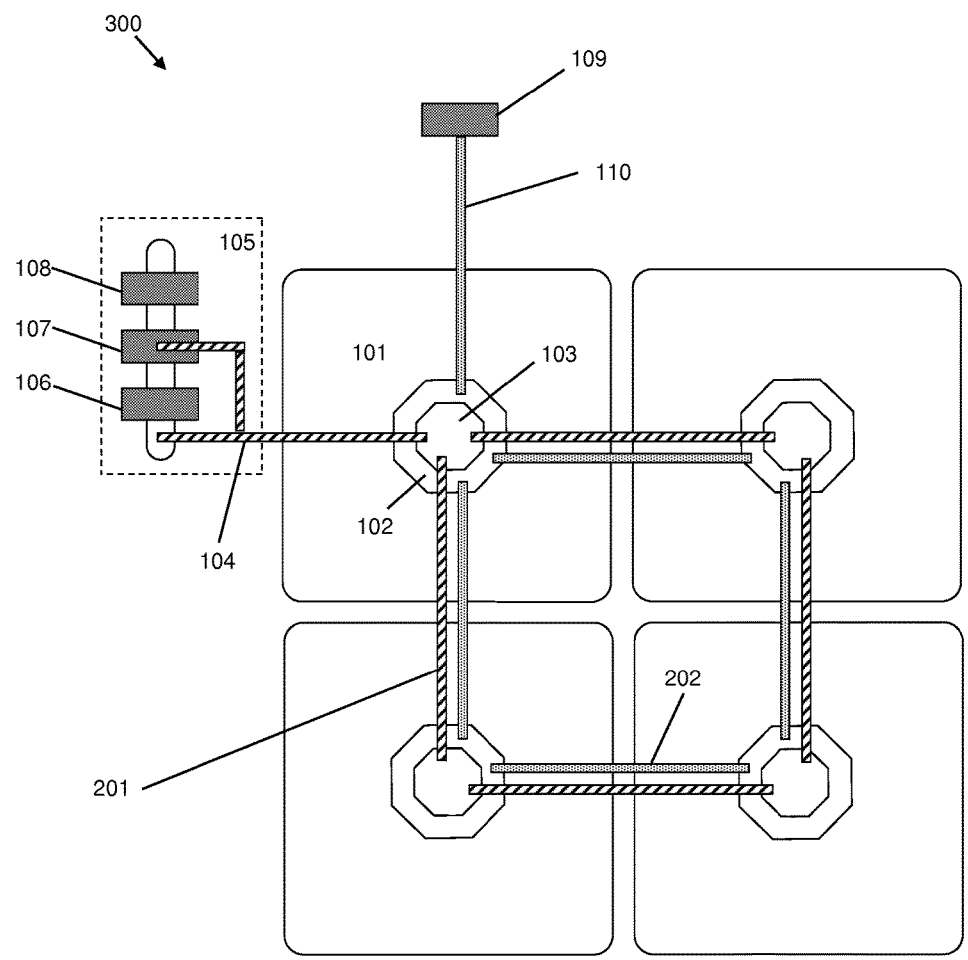
FIG. 3 shows a 4TCIS pixel according to an alternative embodiment of the present invention.

FIG. 3 illustrates a layout view of a 4TCIS pixel 300 employing multiple transfer gates 102 according to an alternative embodiment of the present invention. According to this exemplary embodiment, the pixel 300 comprises four distinct photosensitive elements 101, e.g. pinned photodiodes. Each photosensitive element 101 has associated with it a transfer gate 102, which according to the exemplary embodiment of FIG. 3 is a ring transfer gate 102 located centrally within the photosensitive element 101, although other positions and/or geometries of the transfer gate are contemplated. As in the embodiment of FIG. 2, the four charge storage elements, e.g. floating diffusion regions 103 are connected together by a set of first electrical connections 201, preferably ohmic, thereby placing them in mutual electrical contact. The total charge accumulated within the combined floating diffusion may be read out by a single set of readout devices 105. The four transfer gates 102 are connected together by a set of second electrical connections 202 (again electrically isolated from the first set of electrical connections 201), preferably ohmic, for placing the transfer gates 102 in mutual electrical contact. Although FIG. 3 illustrates a 4TCIS pixel comprising a 2×2 arrangement of photosensitive elements, those skilled in the art will appreciate that other arrangements are possible which also fall within the scope of the claimed invention.

Figure 4:
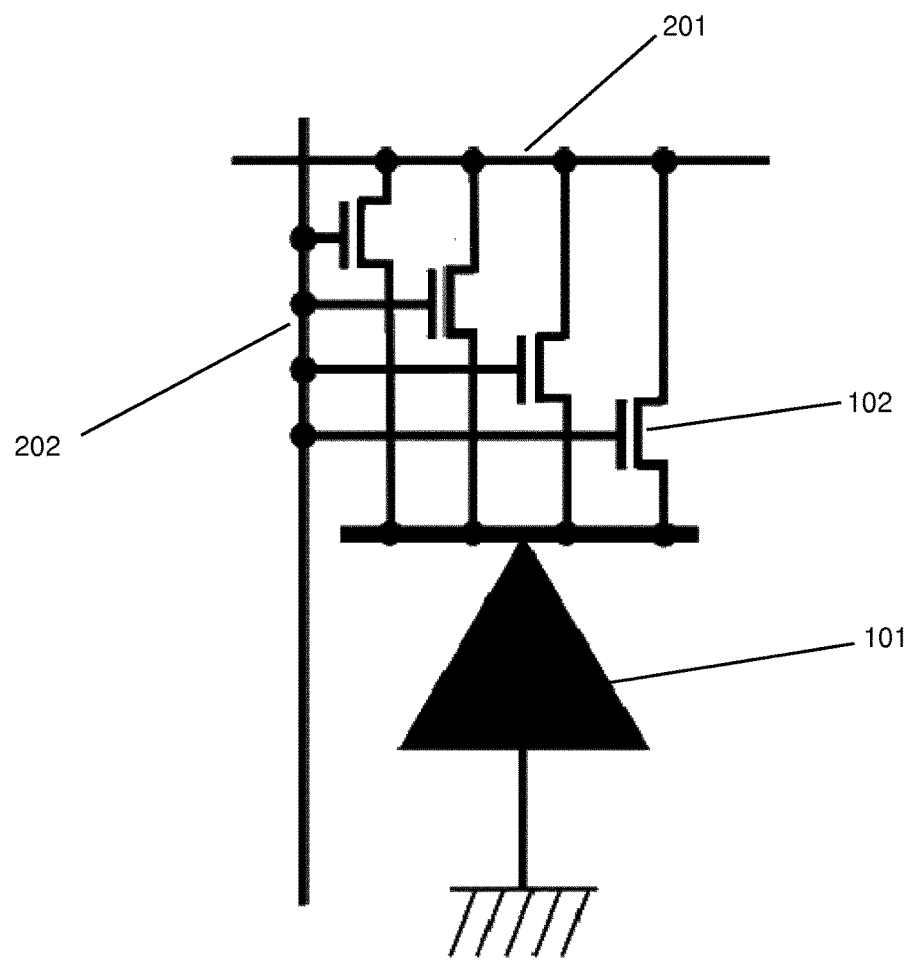
FIG. 4 shows a schematic corresponding to a 4TCIS pixel of the embodiment illustrated in FIG. 2.

FIG. 4 is a schematic which corresponds to the embodiment of a 4TCIS pixel illustrated in FIG. 2. The transfer gate 102 is a transistor device, where a voltage applied to the gate enables the transfer gate 102 to be controlled. In this embodiment the gates of the four transfer gates 102 are connected in parallel 202. This enables them to be controlled simultaneously.

Figure 5:
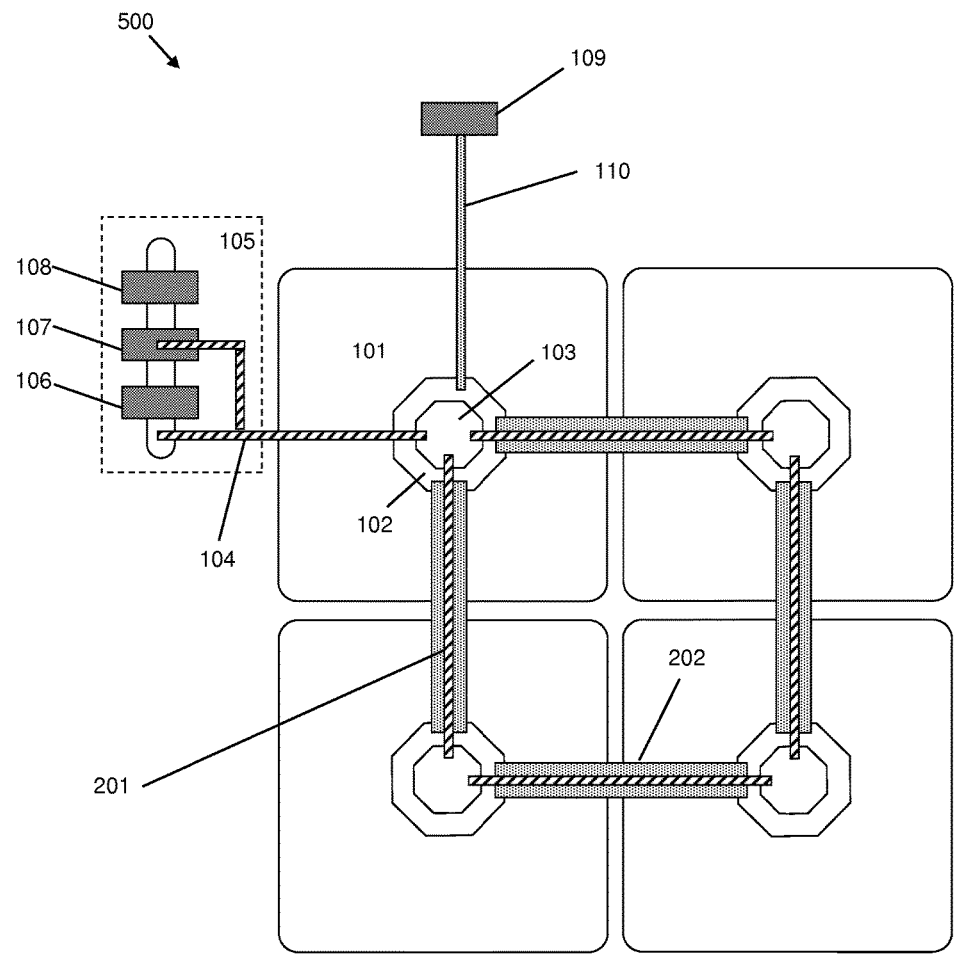
FIG. 5 shows a 4TCIS pixel according to an alternative embodiment of the present invention.

FIG. 5 illustrates a layout view of a 4TCIS pixel 500 employing multiple transfer gates 102 according to an alternative embodiment of the present invention (a variation of the FIG. 3 embodiment, whereby like features have like functions). According to the exemplary embodiment of FIG. 5 the set of first electrical connections 201 and the set of second electrical connections 202, each preferably ohmic, occupy different layers within the pixel structure. They are again electrically isolated from each other.

One technique known in the art for increasing the sensitivity of a 4TCIS without increasing image lag is the so-called binning method. Here, several neighboring 4TCIS pixels may be addressed in groups, e.g. 2×2. By averaging the outputs of multiple pixels, better sensitivity in low-light conditions may be achieved, albeit at the expense of reduced resolution. In such a 2×2 configuration, each pixel is associated with 4 transistors such that a 2×2 group of pixels would comprise a total of 16 transistors. According to the present invention, a single pixel having the same net size as said 2×2 group comprises a total of 7 transistors: 4 transfer gate transistors and 3 shared transistors for performing reset, amplification and selection. Therefore 4TCIS pixels according to the present invention may achieve a larger fill factor compared to conventional 4TCIS pixels used in a binning scheme such as that described above. Furthermore, it is anticipated that 4TCIS pixels according to the present invention may be more cost effective and simpler to manufacture compared with 4TCIS pixels employing a binning arrangement, owing to the reduced number of transistor devices required per pixel unit.

A further advantage of the 4TCIS pixel according to the present invention is that the pixel size can be scaled up without significant re-optimization of the pixel design. For prior art 4TCIS pixels, realizing a different pixel size often requires optimization of the layout for that specific size.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A CMOS image sensor pixel comprising:
    a photosensitive element for generating a charge in response to incident light;
    a plurality of charge storage elements;
    a plurality of transfer gates for enabling the transfer of charge between the photosensitive element and an associated one of the charge storage elements; and
    one or more first electrical connections for placing at least two of the plurality of charge storage elements in mutual electrical contact.

2. The CMOS image sensor pixel according to claim 1, wherein the one or more first electrical connections are ohmic connections within a conductive layer.

3. The CMOS image sensor pixel according to claim 1, further comprising one or more second electrical connections for controlling the plurality of transfer gates.

4. The CMOS image sensor pixel according to claim 3, wherein the plurality of transfer gates is connected in parallel.

5. The CMOS image sensor pixel according to claim 1 comprising four transfer gates placed within the perimeter of the photosensitive element and positioned such that the four transfer gates form the vertices of a parallelogram.

6. The CMOS image sensor pixel according to claim 1, wherein the photosensitive element comprises a pinned photodiode.

7. The CMOS image sensor pixel according to claim 1, wherein each charge storage element comprises a floating diffusion region.

8. The CMOS image sensor pixel according to claim 1, further comprising:
    a reset transistor;
    an amplification transistor; and
    a select transistor.

9. The CMOS image sensor pixel according to claim 8, wherein the reset transistor, amplification transistor and select transistor are shared by at least two of the plurality of charge storage elements.

10. An image sensor comprising one or more CMOS image sensor pixels according to claim 1.

11. A CMOS image sensor pixel comprising:
an arrangement of two or more photosensitive elements, each configured to generate a charge in response to incident light;
a plurality of charge storage elements;
a plurality of transfer gates for enabling the transfer of charge between each of the two or more photosensitive elements and an associated one of the charge storage elements, each transfer gate comprising a gate for controlling the state of the transfer gate in response to an applied voltage;
one or more first electrical connections for placing at least two of the plurality of charge storage elements in mutual electrical contact; and
one or more second electrical connections for placing the plurality of gates in mutual electrical contact.

12. The CMOS image sensor pixel according to claim 11, wherein the one or more first electrical connections are ohmic connections within a conductive layer.

13. The CMOS image sensor pixel according to claim 11, wherein the one or more second electrical connections are ohmic connections within a conductive layer.

14. The CMOS image sensor pixel according to claim 11, wherein each photosensitive element comprises a pinned photodiode.

15. The CMOS image sensor pixel according to claim 11, wherein each charge storage element comprises a floating diffusion region.

16. The CMOS image sensor pixel according to claim 11, further comprising:
a reset transistor;
an amplification transistor; and
a select transistor.

17. The CMOS image sensor pixel according to claim 16, wherein the reset transistor, amplification transistor and select transistor are shared by at least two of the plurality of charge storage elements.

18. The CMOS image sensor pixel according to claim 11 comprising 4 photosensitive elements arranged in a 2×2 configuration.

19. An image sensor comprising one or more CMOS image sensor pixels according to claim 11.

20. A CMOS image sensor pixel comprising:
an arrangement of two or more photosensitive elements, each configured to generate a charge in response to incident light;
a plurality of charge storage elements;
a plurality of transfer gates for enabling the transfer of charge between each of the two or more photosensitive elements and an associated one of the charge storage elements;
one or more first electrical connections for placing at least two of the plurality of charge storage elements in mutual electrical contact; and
one or more second electrical connections for controlling the plurality of transfer gates in parallel.

21. The CMOS image sensor pixel according to claim 20, further comprising a controller configured to control the plurality of transfer gates simultaneously.

* * * * *